(12) United States Patent
Liebl

(10) Patent No.: US 10,514,405 B2
(45) Date of Patent: Dec. 24, 2019

(54) METHOD AND APPARATUS FOR PROCESSING MEASUREMENT TUPLES

(71) Applicant: Rohde & Schwarz GmbH & Co. KG, München (DE)

(72) Inventor: Detlev Liebl, Fürstenfeldbruck (DE)

(73) Assignee: ROHDE & SCHWARZ GMBH & CO. KG

(*) Notice: Subject to any disclaimer, the term of this patent is extended or adjusted under 35 U.S.C. 154(b) by 0 days.

(21) Appl. No.: 15/204,367

(22) Filed: Jul. 7, 2016

(65) Prior Publication Data

US 2017/0184649 A1  Jun. 29, 2017

(30) Foreign Application Priority Data

Dec. 28, 2015 (EP) .................................... 15202822

(51) Int. Cl.
| | |
|---|---|
| G01R 29/08 | (2006.01) |
| G01R 13/40 | (2006.01) |
| G01R 13/02 | (2006.01) |
| G09G 3/20 | (2006.01) |
| G06T 11/20 | (2006.01) |

(52) U.S. Cl.
CPC ..... G01R 29/0892 (2013.01); G01R 13/0236 (2013.01); G01R 13/408 (2013.01); G06T 11/206 (2013.01); G09G 3/2003 (2013.01)

(58) Field of Classification Search
None
See application file for complete search history.

(56) References Cited

U.S. PATENT DOCUMENTS

| | | | | |
|---|---|---|---|---|
| 4,260,980 A | * | 4/1981 | Bates .................... | G01S 15/931 340/436 |
| 4,464,656 A | * | 8/1984 | Nakamura ............. | G09G 1/162 345/440.1 |
| 5,162,723 A | * | 11/1992 | Marzalek ............... | G01R 23/16 324/121 R |
| 5,745,071 A | * | 4/1998 | Blackmon, Jr. ........ | G01S 13/878 342/192 |
| 7,558,685 B2 | * | 7/2009 | Wegener ............... | G06F 17/141 341/61 |
| 2005/0216241 A1 | * | 9/2005 | Entin ................... | G06F 11/0709 703/2 |
| 2006/0097730 A1 | * | 5/2006 | Park ..................... | G01R 31/088 324/534 |

(Continued)

FOREIGN PATENT DOCUMENTS

CN        101 526 431 A        9/2009

OTHER PUBLICATIONS

PJ McKerrow, Computer Systems Performance Measurement: Theory and Practice, 1984, Doctor of Philosophy thesis, Department of Computer Science, University of Wollongong, http://ro.uow.edu.au/theses/1293.*

(Continued)

*Primary Examiner* — Michael J Cobb
(74) *Attorney, Agent, or Firm* — Shumaker & Sieffert, P.A.

(57) ABSTRACT

A measurement apparatus comprising a detection unit configured to provide measurement tuples, each measurement tuple (T) including a high frequency signal amplitude (a) of a high frequency signal (S); and a coding unit configured to encode the high frequency signal amplitude (a) of each provided measurement tuple.

10 Claims, 3 Drawing Sheets

(56) References Cited

U.S. PATENT DOCUMENTS

| | | | |
|---|---|---|---|
| 2006/0170555 A1* | 8/2006 | Sweeney, II | G06K 7/0095 |
| | | | 340/572.7 |
| 2006/0273255 A1* | 12/2006 | Volkov | G01S 7/024 |
| | | | 250/336.1 |
| 2007/0091091 A1* | 4/2007 | Gardiner | G06T 11/206 |
| | | | 345/440 |
| 2009/0306936 A1 | 12/2009 | Kawabata et al. | |
| 2009/0309879 A1 | 12/2009 | Gorbics | |
| 2010/0030528 A1* | 2/2010 | Smith | G01V 11/00 |
| | | | 703/1 |
| 2010/0231398 A1 | 9/2010 | Engholm et al. | |
| 2013/0027244 A1* | 1/2013 | Babakhani | G01S 13/89 |
| | | | 342/179 |
| 2015/0265206 A1* | 9/2015 | Sheinkopf | G10L 25/66 |
| | | | 600/586 |
| 2017/0177199 A1* | 6/2017 | Niu | G06F 3/04845 |
| 2017/0248692 A1* | 8/2017 | Zivkovic | G01S 7/352 |

OTHER PUBLICATIONS

Communication for European Application No. 15202822.1 (dated Jun. 15, 2016).

Examination Report from counterpart European Application No. 15202822.1, dated Sep. 5, 2018, 5 pp.

Response to Communication dated Jul. 10, 2017, from counterpart European Patent Application No. EP 15202822.1, filed on Sep. 7, 2017, 23 pp.

* cited by examiner

METHOD AND APPARATUS FOR PROCESSING MEASUREMENT TUPLES

PRIORITY CLAIM

This application claims the priority benefit of European patent application number 15202822.1, filed Dec. 28, 2015, the disclosure of which is incorporated herein by reference in its entirety.

TECHNICAL FIELD

The present invention relates to a method and apparatus for processing measured high frequency signals.

TECHNICAL BACKGROUND

There exists a variety of different measurement devices which are provided to measure high frequency signals. A direction finding device uses radio locating techniques to locate an object. The respective object is located by measuring the characteristics of received radio waves. The received radio waves can comprise radio waves transmitted by the object to be located or backscattered radio waves. Another example of a measurement device adapted to process high frequency signals is a digital oscilloscope which can draw a graph of an electrical signal. A digital oscilloscope uses an analog-to-digital converter to convert the measured signal into digital information. The digital oscilloscope acquires the waveform of the input signal as a series of samples and stores these samples until enough samples have been accumulated to describe a waveform.

Most measurement devices comprise an output unit, in particular a display to output the measured results. A display unit of a conventional measurement apparatus comprises a two-dimensional screen. The employed display unit is often a digital display unit comprising a plurality of picture elements or pixels. The pixel forms the smallest addressable element where its address corresponds to its physical coordinates on the respective screen. The pixels of a screen can be manufactured in a two-dimensional grid which can be represented using dots or squares. Screens comprising a plurality of pixels are two-dimensional. However, in many measurement applications, the measured signals comprise more than two parameters which cannot be displayed altogether on a two-dimensional screen. For example, in radio location, an output signal to be displayed by the direction finding device can comprise an amplitude of a high frequency signal reflected or transmitted by an object located at two-dimensional space coordinates x, y or three-dimensional space coordinates x, y, z. Further, a high frequency signal to be displayed by an oscilloscope can comprise a signal amplitude frequency spectrum varying at different points in time.

Accordingly, there is a need to provide a method and apparatus for processing more dimensional measurement tuples such that they can be output by a two-dimensional display unit.

SUMMARY OF THE INVENTION

The invention provides according to a first aspect a measurement apparatus comprising
a detection unit configured to provide measurement tuples, each measurement tuple including a high frequency signal amplitude of a high frequency signal and
a coding unit configured to encode the high frequency signal amplitude of each provided measurement tuple.

In a possible embodiment of the measurement apparatus according to the first aspect of the present invention, the measurement apparatus further comprises an output unit adapted to output the measurement tuples with the encoded high frequency signal amplitudes.

In a further possible embodiment of the measurement apparatus according to the first aspect of the present invention, the coding unit is configured to encode the high frequency signal amplitude of each provided measurement tuple by a corresponding image point density.

In a further possible embodiment of the measurement apparatus according to the first aspect of the present invention, the output unit comprises a display configured to display measurement tuples with the encoded high frequency signal amplitude on a high resolution screen comprising a plurality of image pixels,
wherein distances between active illuminating image pixels of said high resolution screen are controlled by a display control unit in response to the encoded image point densities provided by said coding unit.

In a further possible embodiment of the measurement apparatus according to the first aspect of the present invention, each measurement tuple provided by the detection unit is formed by a measurement triple including a high frequency signal amplitude of a high frequency signal, at a frequency of said high frequency signal at a point in time.

In a further possible embodiment of the measurement apparatus according to the first aspect of the present invention, each measurement tuple provided by the detection unit is formed by a measurement triple including a high frequency signal amplitude of a high frequency signal at two-dimensional space coordinates.

In a further possible embodiment of the measurement apparatus according to the first aspect of the present invention, the coding unit is configured to encode the high frequency signal amplitude of the high frequency signal as a number of active illuminating image pixels per display area of the high resolution screen.

In a further possible embodiment of the measurement apparatus according to the first aspect of the present invention, the coding unit is configured to encode the high frequency signal amplitude of the high frequency signal in a normal display operation mode by increasing proportionally or logarithmically the number of active illuminating image pixels per display area of said high resolution screen with an increasing value of the high frequency signal amplitude.

In a further possible embodiment of the measurement apparatus according to the first aspect of the present invention, the coding unit is configured to encode the signal amplitude of the high frequency signal in an inverted display operation mode by reducing proportionally or logarithmically the number of active illuminating image pixels per display area of the high resolution screen with an increasing value of the high frequency signal amplitude.

In a further possible embodiment of the measurement apparatus according to the first aspect of the present invention, the measurement apparatus further comprises a selection unit adapted to select display regions of the high resolution screen and/or display lines comprising the same encoded image point density.

In a further possible embodiment of the measurement apparatus according to the first aspect of the present invention, the coding unit is further configured to perform a colour-coding of the measurement tuples provided by the detection unit.

In a further possible embodiment of the measurement apparatus according to the first aspect of the present invention, the display is configured to output display lines comprising the same image point density as contour lines.

In a further possible embodiment of the measurement apparatus according to the first aspect of the present invention, in the normal display operation mode a display region comprising a maximum image point density is marked as a maximum high frequency signal amplitude and in the inverted display operation mode a display region comprising a maximum image point density is marked as a minimum high frequency signal amplitude.

In a further possible embodiment of the measurement apparatus according to the first aspect of the present invention, a resolution of the high resolution screen as a whole or of a display region selected by a selection unit of said measurement apparatus is adjustable.

The invention further provides according to a second aspect a signal analyzer comprising
a detection unit configured to provide measurement tuples, each measurement tuple including a high frequency signal amplitude of a high frequency signal at a frequency of said high frequency signal at a point in time and
a coding unit configured to encode the high frequency signal amplitude of each provided measurement tuple.

The invention further provides according to a third aspect an object detection device comprising
a detection unit configured to provide measurement tuples of an object, each measurement triple including a signal amplitude of a high frequency signal reflected or transmitted by said object and
a coding unit configured to encode the high frequency amplitude of each measurement tuple.

The invention further provides according to a fourth aspect a digital oscilloscope comprising
a detection unit configured to provide measurement tuples, each measurement tuple including a high frequency signal amplitude of a high frequency signal at a frequency of said high frequency signal at a point in time and
a coding unit configured to encode the high frequency signal amplitude of each provided measurement tuple.

The invention further provides according to a fifth aspect a method for processing measurement tuples, comprising the steps of:
providing measurement tuples, each measurement tuple comprising a high frequency signal amplitude of a high frequency signal at a frequency of said high frequency signal at a point in time and
encoding the high frequency signal amplitude of each measurement tuple.

In a possible embodiment of the method for processing measurement tuples according to the fifth processing of the present invention, the high frequency signal amplitude of each tuple is encoded by a corresponding image point density.

In a possible embodiment of the method for processing measurement tuples according to the fifth aspect of the present invention, each measurement tuple comprises a high frequency signal amplitude of a high frequency signal at a frequency of said high frequency signal at a point in time, wherein the frequency of said high frequency signal is at least 1 MHz.

The invention further provides according to a sixth aspect a method for detecting an object, comprising the steps of:
providing measurement tuples, each measurement tuple including a signal amplitude of a high frequency signal reflected or transmitted by an object and
encoding the high frequency signal amplitude of each measurement tuple.

In a possible embodiment of the method for detecting an object according to the sixth aspect of the present invention, the high frequency signal comprises a frequency of at least 1 MHz.

In a further possible embodiment of the method for detecting an object according to the sixth aspect of the present invention, the high frequency signal amplitude of each tuple is encoded by a corresponding image point density.

BRIEF DESCRIPTION OF THE DRAWINGS

In the following, possible embodiments of the different aspects of the present invention are described with reference to the following figures in an elucidative and unlimitative way as follows.

DETAILED DESCRIPTION OF EMBODIMENTS

Figure 1:
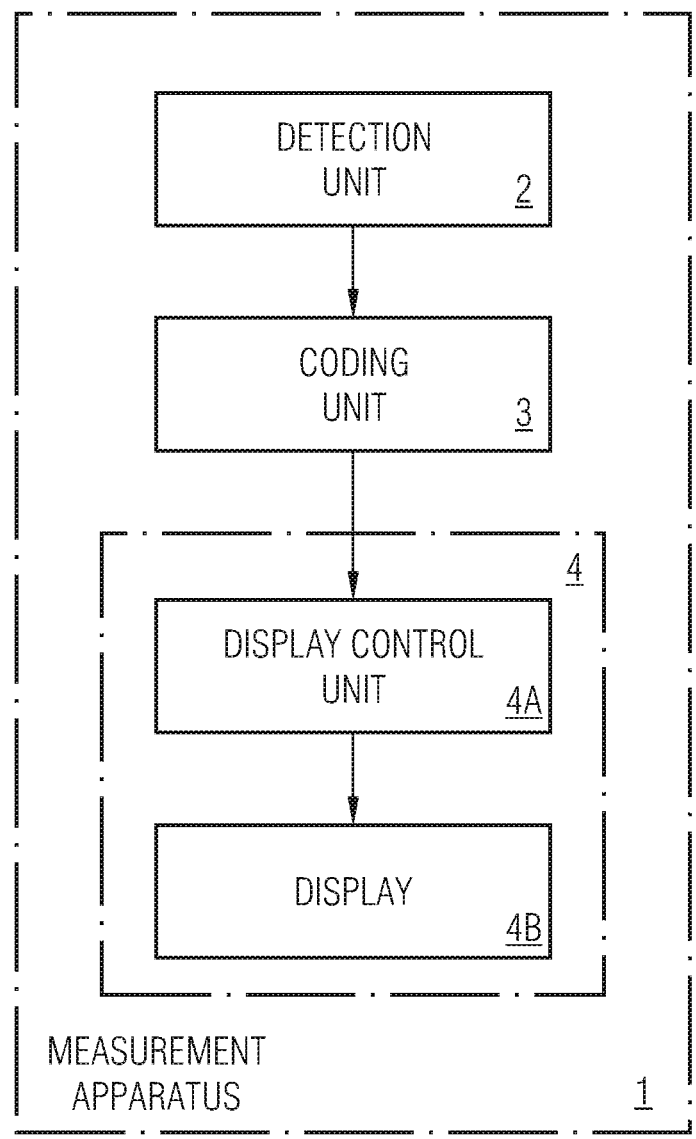
FIG. 1 shows a block diagram of a possible exemplary embodiment of a measurement apparatus according to the first aspect of the present invention.

FIG. 1 shows a block diagram of a possible exemplary embodiment of a measurement apparatus 1 according to the first aspect of the present invention. The measurement apparatus 1 comprises a detection unit 2 configured to provide measurement tuples T. Each measurement tuple T includes a high frequency signal amplitude of a high frequency signal S. In a possible embodiment, the high frequency signal S comprises a frequency of more than 3 MHz. The measurement apparatus 1 further comprises a coding unit 3 configured to encode the high frequency signal amplitude of each provided measurement tuple. A measurement tuple T can comprise a finite ordered list of measurement values. In possible embodiments, the measurement tuples T are n-tuples, wherein n is a non-negative integer bigger than or equal to 3 (n≥3). The measurement tuple T can in a possible embodiment be formed by a measurement triple comprising three measurement parameters of a high frequency signal S. In a possible embodiment, the measurement tuple can be formed by a measurement triple a, f, t including a high frequency signal amplitude a of a high frequency signal S at a frequency f of the high frequency signal S at a point in time t. In an alternative embodiment, the measurement tuple T can be provided by a measurement triple a, x, y including a high frequency signal amplitude of a high frequency signal S at two-dimensional space coordinates x, y. The coding unit 3 is configured to encode the high frequency amplitude a of each measurement tuple T provided by the detection unit 2 of the measurement apparatus 1.

The measurement apparatus 1 as shown in FIG. 1 can be integrated in a mobile measurement device.

In the embodiment illustrated in FIG. 1, the measurement apparatus 1 further comprises an output unit 4 adapted to output the measurement tuples T with the encoded high frequency signal amplitudes a. In the embodiment shown in FIG. 1, the output unit 4 comprises a display control unit 4A and a display 4B. The display 4 can comprise a plurality of image pixels. The display 4 is configured to display the measurement tuples T with the encoded high frequency signal amplitude on a high resolution screen comprising the plurality of image pixels. The distances between active illuminating image pixels of the high resolution screen of the display 4B are controlled by the display control unit 4A in response to the encoded image point densities provided by the coding unit 3 of the measurement apparatus 1. The measurement tuples T provided by the detection unit 2 are formed in a possible embodiment by measurement triples a, f, t including the high frequency signal amplitude of the high frequency signal S at a specific signal frequency f of the high frequency signal at a given point in time t. Alternatively, the measurement tuples T can also be formed by the measurement triple a, x, y including a high frequency amplitude a of a high frequency signal S at two-dimensional space coordinates x, y of an object reflecting or transmitting the high frequency signal S. The coding unit 3 of the measurement apparatus 1 is configured in a possible embodiment to encode the high frequency signal amplitude of the high frequency signal S as a number of active illuminating image pixels per display area of the high resolution screen of the display 4B.

In a possible embodiment, the coding unit 3 of the measurement apparatus 1 can operate in two different operation modes. In a first normal display mode, the coding unit 3 is configured to encode the high frequency signal amplitude of the high frequency signal S by increasing proportionally or logarithmically the number of active illuminating image pixels per display area of the high resolution screen of the display 4B with increasing values of the high frequency signal amplitude.

In the second inverted display operation mode, the coding unit 3 is configured to encode the signal amplitude of the high frequency signal S by reducing proportionally or logarithmically the number of active illuminating image pixels per display area of the high resolution screen of the display 4B with increasing values of the high frequency signal amplitude. In a possible embodiment, the measurement apparatus 1 comprises a user interface having a keypad. In a possible embodiment of the measurement apparatus 1, keys are provided for switching between the normal display operation mode and the inverted display operation mode.

In a further possible embodiment, the measurement apparatus 1 comprises a selection unit adapted to select display regions of the high resolution screen comprising the same encoded image point density. In a further possible embodiment, the selection unit is further adapted to select display lines comprising the same encoded image point density.

In a further possible embodiment of the measurement apparatus 1 according to the first aspect of the present invention, the coding unit 3 is further configured to perform also a colour-coding of the received measurement tuples T provided by the detection unit 2. In a possible embodiment, in the normal display mode, a display region comprising a maximum image point density can be marked by a user via the user interface of the measurement apparatus 1 as a maximum high frequency signal amplitude. Further, in the inverted display operation mode, a display region comprising a maximum image point density can be marked by the user as a minimum high frequency signal amplitude.

A resolution of the high resolution screen of the display 4B as a whole or the resolution of a display region selected by the selection unit can be adjusted by the user or by a control unit. The set operation mode M or markings and the adjusted resolution can be memorized for the next measurement session. The selected display areas can be zoomed for more detailed analysis. Further, numerical signal values of selected display areas can be displayed on the screen of the display 4B.

The measurement apparatus 1 as illustrated in FIG. 1 can be a signal analyzer configured to analyze high frequency signals having a frequency of more than 3 MHz.

The measurement apparatus 1 as illustrated in FIG. 1 can also be formed by an object detection device configured to detect the location of an object. The object detection device comprising the measurement apparatus 1 as shown in FIG. 1 comprises a detection unit 2 adapted to provide measurement tuples T of an object, wherein each measurement triple includes a signal amplitude of a high frequency signal S reflected or transmitted by the object and a coding unit 3 configured to encode the high frequency amplitude of each measurement tuple T.

The measurement apparatus 1 as illustrated in FIG. 1 can also be implemented in a digital oscilloscope according to a further aspect of the present invention. The digital oscilloscope comprises a detection unit 2 providing measurement tuples T, wherein each measurement tuple includes a signal amplitude of a high frequency signal at a frequency f of the high frequency signal S at a given point in time t. The coding unit 3 of the oscilloscope is adapted to encode the high frequency signal amplitude of each provided measurement tuple. The oscilloscope further comprises an output unit having a display 4B with a high resolution screen adapted to output the measurement tuples with the encoded high frequency signal amplitudes. The display 4B of the oscilloscope is adapted to display measurement tuples with the encoded high frequency signal amplitude on its high resolution screen comprising a plurality of image pixels, wherein distances between active illuminating image pixels of the high resolution screen are controlled by a display control unit 4A of the oscilloscope in response to the encoded image point densities provided by the coding unit 3 of the oscilloscope.

In a further possible embodiment, the measurement apparatus 1 can be implemented in an object detection device or a direction finding device. The direction finding device comprising the measurement apparatus 1 can be provided for determining a location of a mobile device as transmitted. The detection unit 2 of the direction finding device can receive high frequency signals reflected or transmitted by the object to be located. The detection unit 2 of the direction finding device is configured to provide measurement tuples T of the respective object, wherein each measurement tuple includes a signal amplitude of the reflected or transmitted high frequency signal S and at least two-dimensional coordinates x, y of the respective object. In a possible implementation, a distance between the measurement apparatus 1 and the object is measured on the basis of the difference in the signal power of the received signal compared to an originating signal strength or a transmitted signal reflected by the respective object. Alternatively, the time of arrival TOA can be used if the time of transmission and speed of signal propagation are known. By combining the time of arrival TOA data from several measurement apparatus 1 at different known locations it is possible to provide an estimate of the position of the object even in the absence of knowledge of the time of transmission. An angle of arrival AOA at the measurement apparatus 1 can be determined in a further embodiment by the use of a directional antenna or on the basis of the differential time of arrival at an array of antennas with known location. Further, the angle of arrival AOA data can be combined by a processing unit of the measurement apparatus 1 with displayed distances estimates to establish a location of the object.

Figure 2:
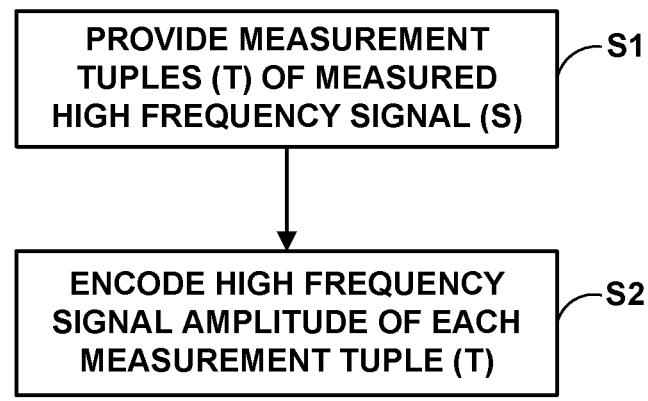
FIG. 2 shows a flowchart of a possible exemplary embodiment of a method for analyzing measurement tuples according to a further aspect of the present invention.

FIG. 2 shows a flowchart of a possible exemplary embodiment of a method for processing measurement tuples according to a further aspect of the present invention. In a first step S1, measurement tuples T of a measured high frequency signal S are provided. The high frequency signal S comprises in a preferred embodiment a frequency f of more than 1 MHz and even more preferably more than 3 MHz. Each measurement tuple T can comprise a high frequency signal amplitude of a high frequency signal S at a frequency f of the high frequency signal at a point in time t. Alternatively, the measurement tuple T can also comprise a high frequency signal amplitude of a high frequency signal S with at least two coordinates x, y for a detected physical object. This object can be for instance a transmitter or a mobile communication device.

In a further step S2, the high frequency signal amplitude of each measurement tuple T is encoded. In a possible embodiment, the measurement tuple T is a measurement triple comprising three signal parameters. In an alternative embodiment, each tuple T can comprise more than three signal parameters, for instance a signal amplitude of a high frequency signal S along with three-dimensional coordinates x, y, z of a detected object. In a possible embodiment, the high frequency signal amplitude of each tuple T is encoded in step S2 by a corresponding image point density. The encoded high frequency signal S can then be displayed on a high resolution screen of a display. The measurement tuples T are displayed with the encoded high frequency signal amplitude on the high resolution screen comprising a plurality of image pixels, wherein distances between active illuminating image pixels of the high resolution screen are controlled in response to the encoded image point densities.

Figure 3:
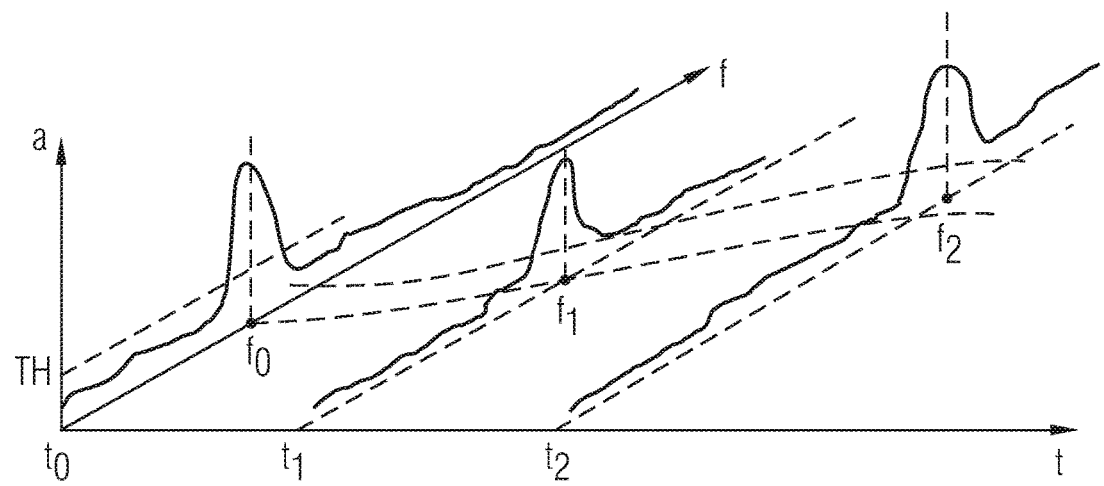
FIG. 3, 4 show signal diagrams for illustrating the operation of a measurement apparatus and analyzing method according to different aspects of the present invention.
Figure 4:
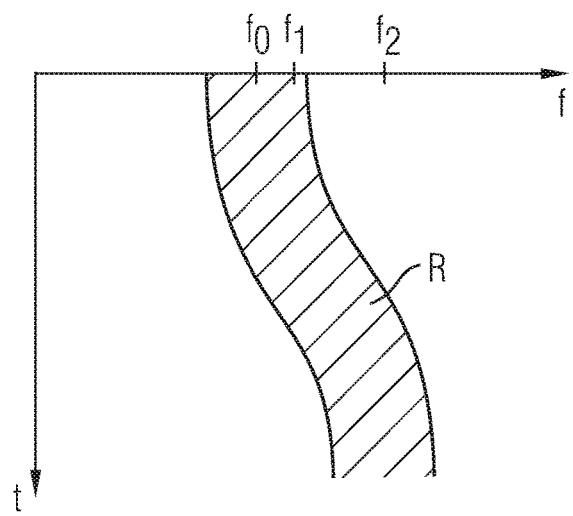

FIG. 3 shows a diagram of a measured high frequency signal having a signal amplitude a and a frequency f at a given point in time t. As can be seen in FIG. 3, at the different points in time t0, t1, t2, the frequency spectrum of the high frequency signal has changed. In the given example, a signal amplitude peak occurs at different frequencies f0, f1, f2 for different measurement times t0, t1, t2, respectively. A high amplitude range including the peak is drifting over time as illustrated in FIG. 3. The method and apparatus according to the present invention detect the measurement triples including the high frequency signal amplitude a of the high frequency signal S with the corresponding frequency f at a given point in time t and performs a transformation which allows to visualize the three-dimensional measurement tuples on a two-dimensional high resolution screen of a display as illustrated in FIG. 4. The high amplitude range R is displayed on the high resolution screen of the display corresponding to the image point density. In a possible embodiment, all signal amplitudes a higher than an adjustable threshold value are displayed with a high image point density as illustrated in FIG. 4. In a further, preferred embodiment, the image point density is proportional to the amplitude value of the high frequency signal amplitude of the respective high frequency signal S at a specific frequency f and at a specific point in time t. The distances between active illuminating image pixels of the high resolution screen are controlled in response to the encoded image point densities. With an increasing amplitude value the image point density is increased proportionally or logarithmically in a normal display operation mode NM. If the user switches to the inverted display operation mode IM, the number of active illuminating image pixels per display area of the high resolution screen are reduced proportionally or logarithmically with the increasing value of the high frequency signal amplitude a. FIG. 4 shows a corridor of high amplitudes a at a frequency range R drifting to higher frequencies over time. In a possible embodiment, the user can select display regions from the high resolution screen comprising the same encoded image point density or comprising an encoded image point density being higher than a selected image point density. For example, a user can select the display region R as shown in FIG. 4, i.e. the frequency range corridor drifting over time t. The user may also select display lines comprising the same encoded image point density which are then output as contour lines. Further, the user can mark a display region R comprising a maximum image point density as a maximum high frequency signal amplitude in the normal operation mode. Further, in the inverted display operation mode IM of the display, a user can mark a display region comprising a maximum image point density at a minimum high frequency signal amplitude region. The diagram illustrated in FIG. 4 can be displayed on a high resolution screen of a digital oscilloscope.

The diagram as illustrated in FIG. 4 forms a so-called waterfall diagram which can be used for analyzing a wide range of different kinds of high frequency signals in different applications. It can be used to optimize measurement parameters of the measurement apparatus and/or signal parameters of the measured high frequency signal S. In a possible embodiment, the encoded high frequency signal provided by the coding unit 3 can be stored in a data memory for further processing or output via an interface of the measurement apparatus 1 to an external processing unit. In a possible embodiment, a waterfall diagram as illustrated in FIG. 4 can be stored in a data memory of the measurement apparatus 1 for further processing or output via a data interface. The waterfall diagram as illustrated in FIG. 4 allows to output more than two signal parameters of a high frequency signal on a two-dimensional high resolution screen of a display or to an image data memory. In a possible embodiment, the encoded measurement tuples T are output to a display unit. In an alternative embodiment, the encoded measurement tuples are stored in a data memory or a data carrier.

The invention claimed is:

1. A measurement apparatus comprising a processing unit implemented in circuitry, the processing unit comprising a detection unit and a coding unit, wherein:

the detection unit is configured to measure a received high frequency signal (S) reflected or transmitted by an object, and to provide measurement tuples (T), each measurement tuple (T) including a high frequency signal amplitude (A) of the measured high frequency signal (S) and at least two-space coordinates of the object reflecting or transmitting the measured high frequency signal (S); and the coding unit is configured to encode the high frequency signal amplitudes (A) of each of the measurement tuples (T) provided by said detection unit, wherein the coding unit is configured to encode the high frequency signal amplitude (A) of each of the provided measurement tuples (T) as a corresponding image point density, the coding unit comprising an output unit adapted to output the measurement tuples (T) with the encoded high frequency signal amplitudes (A), wherein said output unit comprises a display configured to display the measurement tuples (T) with the encoded high frequency signal amplitudes (A) of a high resolution screen comprising a plurality of image pixels, wherein distances between active illuminating image pixels of said high resolution screen are controlled by a display control unit of said output unit in response to the encoded image point densities provided by said coding unit, and wherein said coding unit is configured to encode the high frequency signal amplitudes (A) of the measured high frequency signal (S) as a number of active illuminating image pixels per display area of said high resolution screen of said display, and wherein the measurement apparatus measures an angle of arrival of the measured high frequency signal (S) and a distance between the measurement apparatus and the object, and the processing unit is configured to combine the angle of arrival and the distance to estimate the at least two-space coordinates of the object.

2. The measurement apparatus according to claim 1, wherein said coding unit is configured to encode the high frequency signal amplitude (A) of the measured high frequency signal (S) in a normal display operation mode by increasing proportionally or logarithmically the number of active illuminating image pixels per display area of said high resolution screen of said display with an increasing value of said high frequency signal amplitude.

3. The measurement apparatus according to claim 2, wherein said coding unit is configured to encode the high frequency signal amplitude (A) of the measured high frequency signal (S) in an inverted display operation mode by reducing proportionally or logarithmically the number of active illuminating image pixels per display area of said high resolution screen of the display of said output unit with an increasing value of said high frequency signal amplitude (A).

4. The measurement apparatus according to claim 1, wherein said measurement apparatus further comprises a selection unit adapted to select display regions of said high resolution screen and/or display lines comprising the same encoded image point density.

5. The measurement apparatus according to claim 1, wherein said coding unit is further configured to perform a colour-coding of the measurement tuples (T) provided by said detection unit.

6. The measurement apparatus according to claim 1, wherein the display of said output unit is configured to output display lines comprising the same image point density as contour lines.

7. The measurement apparatus according to claim 3, wherein in the normal display operation mode a display region comprising a maximum image point density is marked as a maximum high frequency signal amplitude and
wherein in the inverted display operation mode a display region comprising a maximum image point density is marked as a minimum high frequency signal amplitude.

8. The measurement apparatus according to claim 1, wherein a resolution of said high resolution screen as a whole or a display region selected by a selection unit of said measurement apparatus is adjustable.

9. A method for processing measurement tuples, comprising the steps of:
measuring an angle of arrival of a measured high frequency signal (S) and a distance between the measurement apparatus and an object;
combining the angle of arrival and the distance to estimate at least two-space coordinates of the object;
providing, by a detection unit of a measurement apparatus, measurement tuples (T), each of the measurement tuples (T) comprising a high frequency signal amplitude (A) of the measured high frequency signal (S) and the at least two-space coordinates of the object reflecting or transmitting the measured high frequency signal (S);
encoding, by a coding unit of the measurement apparatus, the high frequency signal amplitude (A) of each of the measurement tuples (T) as a corresponding image point density; and
displaying, on a display of the measurement apparatus, the measurement tuples (T) with the encoded high frequency signal amplitude (A) on a high resolution screen comprising a plurality of image pixels, wherein distances between active illuminating image pixels of said high resolution screen are controlled in response to the encoded image point densities, and
wherein the high frequency signal amplitude (A) of the measured high frequency signal (S) is encoded as a number of active illuminating image pixels per display area of the display.

10. An object detection device comprising a processing unit implemented in circuitry, the object detection device comprising:
a detection unit configured to measure a received high frequency signal (S) reflected or transmitted by an object, and to provide measurement tuples (T) of the object,
wherein each of the measurement tuples (T) includes a high frequency signal amplitude (A) of the measured high frequency signal (S) reflected or transmitted by said physical object and includes at least two-space coordinates of the physical object reflecting or transmitting the high frequency signal (S), and
wherein the at least two-space coordinates of the object are determined by combining an angle of arrival of the measured high frequency signal (S) and a distance between the measurement apparatus and the object;
a coding unit configured to encode the high frequency signal amplitude (a) of each of the measurement tuples (T) provided by said detection unit, wherein the coding unit is configured to encode the high frequency signal amplitude (a) of each of the provided measurement tuples (T) as a corresponding image point density; and
an output unit comprising a display configured to display the measurement tuples (T) with the encoded high frequency signal amplitude (A) on a high resolution screen comprising a plurality of image pixels, wherein distances between active illuminating image pixels are controlled by a display control unit of said output unit in response to the encoded image point densities provided by said coding unit, and
wherein said coding unit is configured to encode the high frequency signal amplitude (A) of the measured high frequency signal (S) as a number of active illuminating image pixels per display area of said high resolution screen of said display.

* * * * *